United States Patent
She et al.

(10) Patent No.: US 10,011,900 B2
(45) Date of Patent: *Jul. 3, 2018

(54) METHOD OF COATING METALLIC POWDER PARTICLES WITH SILICON

(71) Applicant: United Technologies Corporation, Farmington, CT (US)

(72) Inventors: Ying She, East Hartford, CT (US); James T. Beals, West Hartford, CT (US)

(73) Assignee: United Technologies Corporation, Farmington, CT (US)

( * ) Notice: Subject to any disclaimer, the term of this patent is extended or adjusted under 35 U.S.C. 154(b) by 34 days.

This patent is subject to a terminal disclaimer.

(21) Appl. No.: 15/178,297

(22) Filed: Jun. 9, 2016

(65) Prior Publication Data
US 2016/0289823 A1 Oct. 6, 2016
US 2017/0298502 A9 Oct. 19, 2017

Related U.S. Application Data

(63) Continuation-in-part of application No. 14/604,470, filed on Jan. 23, 2015, now Pat. No. 9,732,422.

(51) Int. Cl.
*C23C 16/02* (2006.01)
*C23C 16/24* (2006.01)
(Continued)

(52) U.S. Cl.
CPC ............ *C23C 16/0209* (2013.01); *B22F 1/02* (2013.01); *C23C 16/24* (2013.01); *C23C 16/442* (2013.01);
(Continued)

(58) Field of Classification Search
CPC combination set(s) only.
See application file for complete search history.

(56) References Cited

U.S. PATENT DOCUMENTS 4,746,547 A * 5/1988 Brown ..................... B01J 2/006
118/303
9,732,422 B2 * 8/2017 She ..................... C23C 16/4417
(Continued)

FOREIGN PATENT DOCUMENTS

EP 2987877 A1 2/2016
EP 3050646 A1 8/2016
(Continued)

OTHER PUBLICATIONS

C.A. Volkert and A.M. Minor, "Focused Ion Beam Microscopy and Micromachining", MRS Bulletin, vol. 32, May 2007.
(Continued)

*Primary Examiner* — Erma C Cameron
(74) *Attorney, Agent, or Firm* — Kinney & Lange, P.A.

(57) ABSTRACT

A method of coating metallic powder particles includes disposing an amount of metallic powder particles in a fluidizing reactor and removing moisture adhered to the powder particles within the reactor with a working gas at an elevated temperature for a predetermined time. The method further includes coating the powder particles in the reactor with silicon present within the precursor gas at an elevated temperature for a predetermined time and purging the precursor gas from the reactor using the working gas.

18 Claims, 9 Drawing Sheets

(51) Int. Cl.
*C23C 16/44* (2006.01)
*C23C 16/442* (2006.01)
*H04M 3/22* (2006.01)
*H04M 3/38* (2006.01)
*H04M 3/42* (2006.01)
*B22F 1/02* (2006.01)

(52) U.S. Cl.
CPC ....... *C23C 16/4417* (2013.01); *H04M 3/2281* (2013.01); *H04M 3/382* (2013.01); *H04M 3/385* (2013.01); *H04M 3/42221* (2013.01); *B22F 2998/10* (2013.01); *B22F 2999/00* (2013.01); *Y02P 10/295* (2015.11)

(56) References Cited

U.S. PATENT DOCUMENTS

| | | | |
|---|---|---|---|
| 2010/0009080 A1* | 1/2010 | Jan Snijders | ....... C23C 16/4481 427/255.28 |
| 2015/0064354 A1 | 3/2015 | Stapel et al. | |
| 2015/0079278 A1 | 3/2015 | Stapel et al. | |
| 2016/0144427 A1 | 5/2016 | Nardi et al. | |

FOREIGN PATENT DOCUMENTS

| | | |
|---|---|---|
| WO | 2015036802 A2 | 3/2015 |
| WO | 2016057250 A1 | 4/2016 |

OTHER PUBLICATIONS

Extended European Search Report, for European Patent Application No. 17175089.6, dated Oct. 23, 2017, 10 pages.

* cited by examiner

METHOD OF COATING METALLIC POWDER PARTICLES WITH SILICON

CROSS-REFERENCE TO RELATED APPLICATION(S)

This application is a continuation-in-part of application Ser. No. 14/604,470 filed Jan. 23, 2015, which is hereby incorporated by reference in its entirety.

BACKGROUND

The present disclosure relates to coating metallic powder particles in general, and to processes for coating metallic powder particles with silicon in particular.

Aluminum alloy materials are widely used in many areas including the aerospace industry for their light weight structural properties and in heat transfer products due to high thermal conductivity. Additive manufacturing of aluminum alloy powders, in particular, via laser based additive processes, has drawn increasing attention. A significant challenge in the laser additive manufacturing of certain alloy powders (e.g., certain aluminum alloy powders) is the high degree to which energy in the form of light waves within a laser beam are reflected away from the alloy powder. As a result of the reflectance, the energy of the reflected light does not appreciably contribute to the additive process. In some instances, it may not be possible to sufficiently increase the intensity of existing laser equipment to overcome the reflectance issue. Even in those instances where the laser intensity can be increased, such a practice can create new detrimental issues; e.g., a higher intensity laser can overheat the powder and cause the powder particles to "ball up" and consequently create a non-uniform deposition layer. Also as a result of the reflectance, present additive manufacturing processes are sometimes limited to certain types of materials. With respect to aluminum alloys, for example, additive manufacturing processes are today typically limited to cast aluminum alloy compositions. These cast aluminum alloy compositions have low reflectance properties that allow them to be used in additive processes, but possess undesirable mechanical and thermal properties.

In addition, alloy powders adsorbed with water moisture can cause significant quality issues of the deposits made by additive manufacturing processes. These issues include porosity, cracks, and blisters.

It would be beneficial to resolve the aforesaid issues and thereby improve additive manufacturing processes and make it possible to additively manufacture certain alloy powders, including additional types of aluminum alloy compositions.

SUMMARY

A method of coating metallic powder particles includes disposing an amount of metallic powder particles in a fluidizing reactor and removing moisture adsorbed to the powder particles within the reactor with a working gas at an elevated temperature for a predetermined time. The method further includes coating the powder particles in the reactor with silicon present within the precursor gas at an elevated temperature for a predetermined time and purging the precursor gas from the reactor using the working gas.

In an embodiment, a method of coating metallic powder particles with silicon includes providing a system having a fluidized bed reactor, a working gas source, a precursor gas source, and a processor adapted to execute instructions to control and monitor operation of the system, wherein the processor is in communication with a memory operable to store the executable instructions. The method further includes disposing an amount of metallic powder particulates within the fluidizing reactor and controlling the system to remove moisture adsorbed to the powder particles disposed within the reactor using a working gas provided from the working gas source at a predetermined temperature for a predetermined time, controlling the system to coat the powder particles disposed within the reactor with silicon present in a precursor gas provided from the precursor gas source at a predetermined temperature for a predetermined time and controlling the system to purge the precursor gas from the reactor using the working gas.

In a further embodiment, a system for coating metallic powder particles with silicon to reduce optical reflectivity includes at least one working gas source, at least one precursor gas source, and at least one fluidizing reactor, wherein the fluidizing reactor is in communication with the working gas source and the precursor gas source. The system further includes a processor adapted to execute instructions to control operation of the system, wherein the executable instructions are operable to control the system to remove moisture adhered to the powder particles disposed within the reactor using a working gas provided from the working gas source at a predetermined temperature, to coat the powder particles disposed within the reactor with a material present within a precursor gas provided from the precursor gas source at a predetermined temperature for a predetermined time and to purge the precursor gas from the reactor using the working gas.

DETAILED DESCRIPTION

According to the present disclosure, a system and method for preparing a metallic material (e.g., aluminum alloy powder) for additive manufacturing is provided. For the purpose of describing the present disclosure, the metallic material is detailed hereinafter as being an aluminum alloy powder. The present disclosure provides particular utility regarding the coating of aluminum alloy particles to control the reflectivity of aluminum alloy powders, but the applicability of the present disclosure is not limited to aluminum alloys. The term "powder" as used herein refers to matter configured in the form of fine discrete particles. The aforesaid particles may assume a variety of different particle sizes; e.g., particles having a diameter in the range of about one micrometer to one hundred and fifty micrometers (i.e., 1-150 µm). The present disclosure is typically used to process particles of a given size (i.e., substantially most of the particles are about 20-55 micrometer diameters) during a particular processing application, but the present disclosure is not limited to processing particles of a specific size. Non-limiting examples of aluminum alloy powders that may be processed using the present disclosure include aluminum 5056, aluminum 6061, aluminum 7075, PANDALLOY aluminum alloy, and others known in the art.

Figure 1:
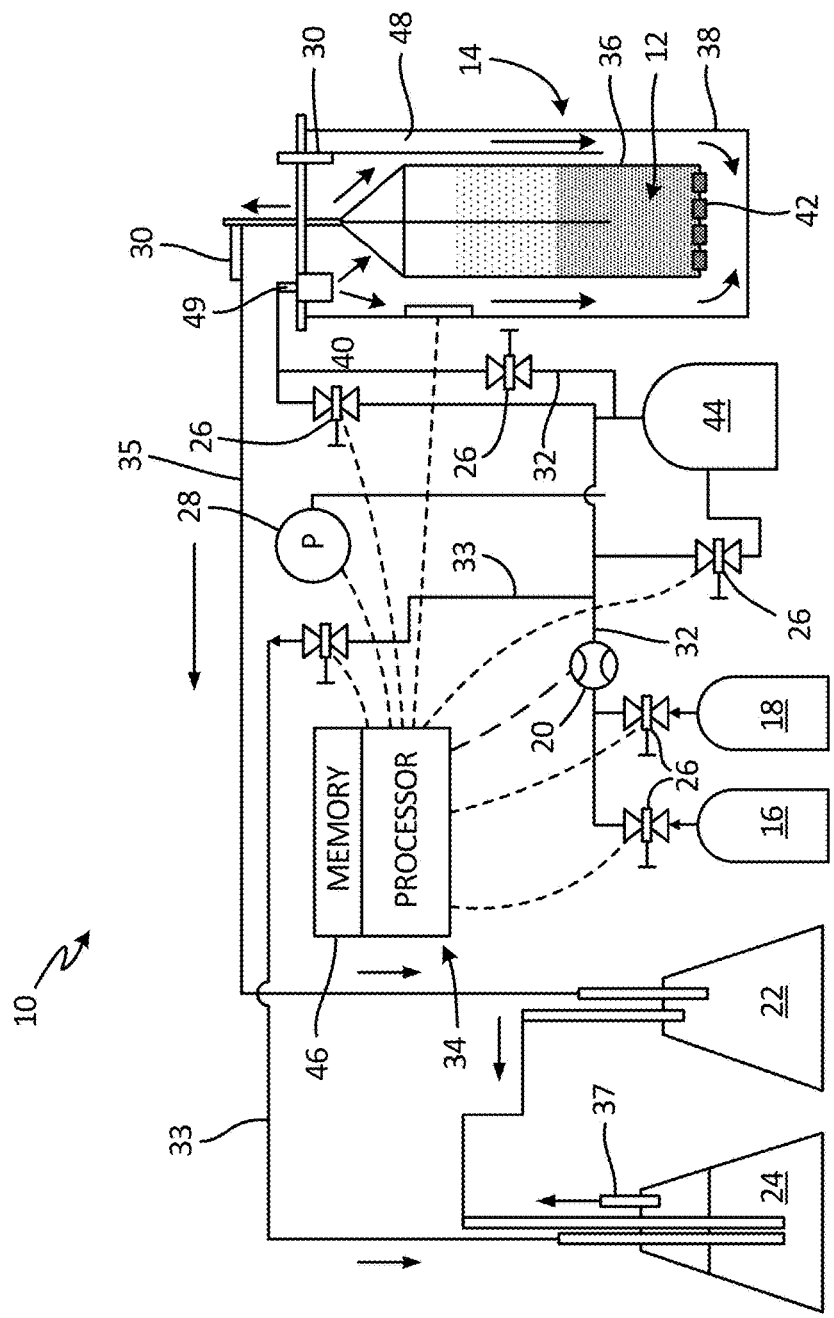
FIG. 1 is a schematic illustration of an embodiment of the present system.

FIG. 1 illustrates a schematic illustration of an exemplary system 10 operable to prepare a metallic material for further processing; e.g., additive manufacturing. The system 10 includes a fluidized bed reactor 14 containing aluminum alloy powders 12, at least one working gas source 16, at least one precursor gas source 18, a mass flow control device 20, an escaped powder collector vessel 22, a liquid (e.g., water) bubbler 24, and various valves 26 and flow measuring devices (e.g., pressure gauges 28, temperature sensing devices 30, etc.) disposed within piping 32 connecting the aforesaid devices. The piping 32 may include bleed line 33, outlet lines 35, vents 37, etc. In addition, a processor 34 may be included in the system 10 in communication with one or more of the aforesaid devices, valves, and flow measuring devices to control and monitor the system 10. The aforesaid system 10 is an example of a system configuration, and the present disclosure is not limited to the specific system illustrated.

The fluidized bed reactor 14 (hereinafter referred to as the "reactor 14") may assume a variety of different configurations. For example, the reactor 14 may be configured to have a single vessel or configured to have both an inner vessel and an outer vessel. The schematic system 10 shown in FIG. 1 illustrates a reactor 14 configured with both an inner vessel 36 and an outer vessel 38. In alternative embodiments, the reactor 14 may include a plurality of independent vessels; e.g., each disposed to fluidize a different powder material. The reactor 14 may include a heat source 40 to heat a fluidizing gas (schematically depicted in FIG. 1), or a heat source may be provided independent of the reactor 14. One or more temperature sensing devices 30 (e.g., thermocouples) may be disposed inside the reactor 14 or may be disposed in the piping 32 leading to and/or from the reactor 14 to sense the temperature of the gases entering the reactor 14, the gas powder mixture within the reactor 14, the gas powder mixture exiting the reactor 14. The reactor 14 may include a distributor (e.g., a porous plate 42) through which gases are introduced into the vessel (e.g., the inner vessel 36).

The working gas source 16 provides at least one gas that is inert and/or one that creates a "reducing atmospheric environment" with respect to the processing of the particular material. The term "reducing atmospheric environment" or "reducing gas" as used herein refers to a gas that is operable to create an environment in which oxidation is prevented by removal of oxygen or other oxidizing gases or vapors. Nitrogen (N2) or hydrogen (H2) are non-limiting examples of gases that can be used to process aluminum alloy powders. Nitrogen (N2) is a non-limiting example of an inert gas and hydrogen (H2) is a non-limiting example of a reducing gas. As will be described hereinafter, the working gas may be used as a medium to heat the powder particles 12 and to remove adsorbed moisture from the powder. The working gas source 16 may assume any form (e.g., pressurized vessel, etc.) appropriate to provide the working gas as required.

The precursor gas source 18 provides one or more gases that include at least one material that coats the powder particles 12 during processing as will be discussed below. The material(s) from the precursor gas(es) that coats the powder particles 12 is one that, when applied in sufficient coating thickness, results in the coated powder particles 12 having a level of reflectivity that is acceptable for subsequent processing of the coated particles 12 within an additive manufacturing process. The specific thickness of the coating on the particles 12 may vary depending on factors such as the coating material, the material of the powder particle, the additive manufacturing process for which the powder particles are being prepared for, etc. The present disclosure is not limited to any particular coating thickness. A precursor gas that enables the deposition of a silicon coating on the powder particles 12 is particularly useful when the present disclosure is used to coat aluminum or aluminum alloy powder particles 12. Specific non-limiting examples of a precursor gas that enables the deposition of a silicon coating on the powder particles 12 include silane ($SiH_4$), disilane ($Si_2H_6$), chlorosilane ($SiH_3Cl$), dichlorosilane ($SiH_2Cl_2$), silicon tetrachloride ($SiCl_4$), trichlorosilane ($SiHCl_3$) and others known in the art. The precursor gas may be used as a medium to heat the powder particles 12 or to maintain the temperature of the powder particles 12 during processing. The precursor gas source 18 may assume any form (e.g., pressurized vessel, etc.) appropriate to provide the first precursor gas as required.

In some embodiments, the present disclosure may utilize a source 44 of one or more additional precursor gases (hereinafter referred to collectively as a source of a "second precursor gas"), each of which can be used to coat the particles 12 of the particular powder material. Examples of acceptable precursor gases that enable the deposition of a silicon coating on aluminum or aluminum alloy powder particles 12 are provided above. The source 44 of the second precursor gas may assume any form (e.g., pressurized vessel, etc.) appropriate to provide the second precursor gas as required.

The mass flow control device 20 is a standard device operable to control flow of gas within a conduit (e.g., piping 32). One or more mass control devices 20 may be used to control the delivery of working gas, first precursor gas, and second precursor gas to the reactor 14.

The liquid bubbler 24 is operable to decrease the temperature of and/or neutralize, gases introduced into the bubbler 24, such as working gases or precursor gases purged from piping upstream of the reactor 14, or working gases or precursor gases purged from the reactor 14. In the latter case, the aforesaid gases may pass through the escaped powder collector vessel 22 prior to entering the bubbler 24. The liquid disposed within the bubbler 24 may depend on the particular application at hand; e.g., water, etc.

The escaped powder collector vessel 22 is a vessel operable to collect powder particles 12 that have escaped from the reactor 14 during processing. For example, in those instances where the working gas is used as a medium to heat the powder particles 12 and is subsequently purged from the reactor 14, the purged working gas may have small amounts of powder particles 12 entrained within the purged working gas. The escaped powder collector vessel 22 is operable to collect the aforesaid powder particles 12 entrained within the purged working gas.

As indicated above, the present system 10 may be controlled, monitored, etc. using a controller having a processor 34. The processor may be adapted (e.g., programmed) to provide signals to and/or receive signals from various components disposed within the system 10 (e.g., valves 26, mass control flow devices 20, the reactor 14, flow measuring devices—e.g., pressure gauges 28, temperature sensing devices 30, etc.—, gas sources, etc.) and use such signals to control and/or monitor the system 10. The processor 34 may include one or more central processing units (CPUs) adapted (e.g., programmed) to selectively execute instructions necessary to perform the control/monitor functions described herein. The functionality of processor 34 may be implemented using hardware, software, firmware, or a combination thereof. The processor 34 may be in communication with (e.g., included with the processor) a memory 46 operable to store the aforesaid programming (e.g., instructions), which memory 46 may be non-volatile or may be in the form of non-transitory computer readable media in communication with the processor 34. A person skilled in the art would be able to adapt (e.g., program) the processor 34 to perform the functionality described herein without undue experimentation.

An exemplary method according to the present disclosure is described hereinafter to illustrate the utility of the present disclosure. The method description provided below is provided in terms of the exemplary system 10 described above. The present disclosure is not limited to the aforesaid exemplary system or the method described below.

Figure 2:
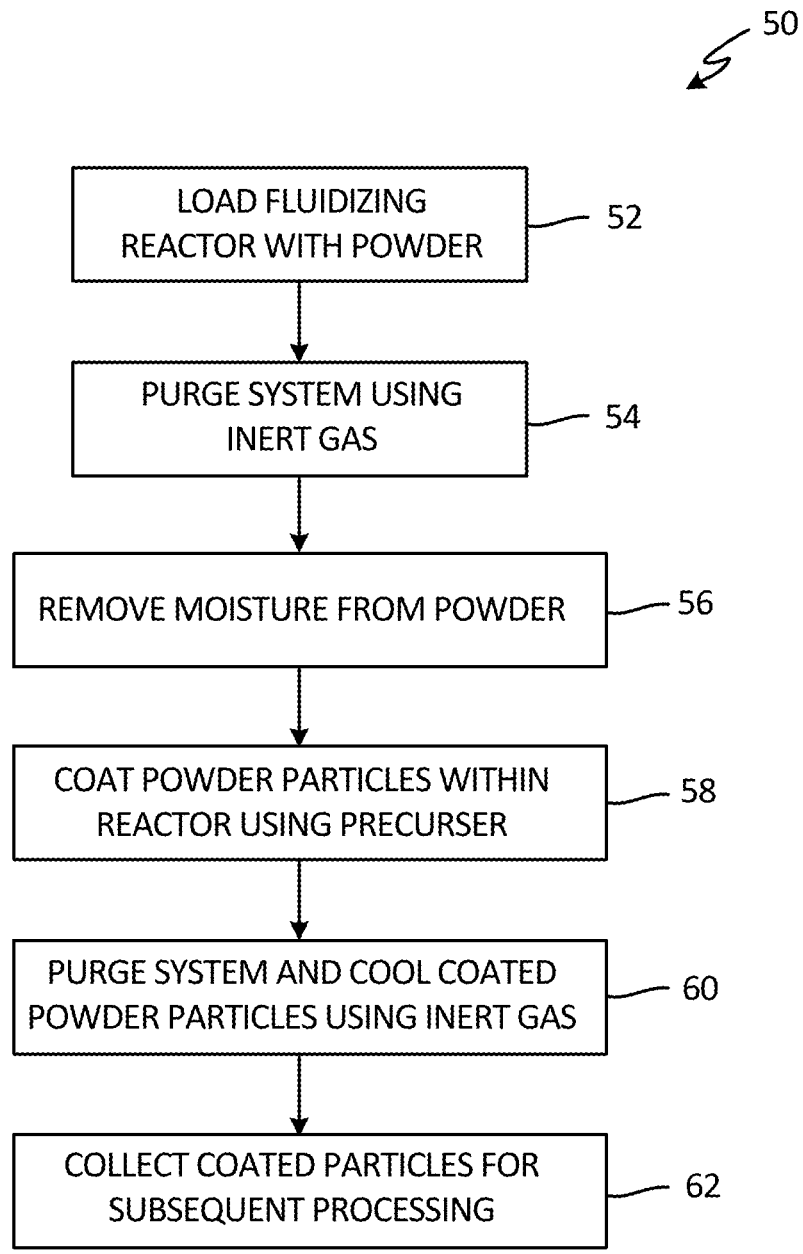
FIG. 2 is a flow chart of an embodiment of the present disclosure.

Now referring to FIG. 2, according to a method embodiment 50 of the present disclosure an amount of powder particles 12 is introduced into the reactor 14 from a powder source (step 52); e.g., introduced into the inner reactor vessel 36. In terms of preparing a powder for subsequent use in an additive manufacturing process, non-limiting examples of acceptable aluminum alloy powders include aluminum 5056, aluminum 6061, aluminum 7075, and PANDALLOY aluminum alloy.

The system 10 is controlled to purge the reactor 14 of ambient air and provide a working gas (e.g., $N_2$) environment within the reactor vessel 36 containing the powder (step 54). The working gas may be introduced into the reactor 14 through piping 32 connecting the working gas source 16 and the reactor 14. In the embodiment shown in the schematic, the working gas enters the reactor 14 within the annular region 48 disposed between the inner vessel 36 and the outer vessel 38 via inlet 49. The system 10 is controlled to provide the working gas at a predefined mass flow using the mass flow control device 20 and valves 26. The working gas is heated prior to or after introduction into the reactor vessel using one or more heat sources 40. The powder particles 12 are "fluidized" within the reactor 14 by the working gas (i.e., suspended within the reactor 14 by the gas traveling within the reactor 14, such that the fluidized powder 12 acts like a fluid). The specific travel path of the working gas within the reactor 14 may vary depending on the configuration of the reactor 14; e.g., in the reactor embodiment shown in the schematic of FIG. 1, the working gas travels within the annular region 48 disposed between the inner vessel 36 and the outer vessel 38, enters and passes through the inner vessel 36 (via the distributor 42), and exits the reactor 14. The exiting working gas is directed through into the liquid bubbler 24 where it is cooled and/or neutralized. The temperature of the working gas within the reactor 14 is sensed and controlled using the one or more temperature sensing devices 30 (e.g., thermocouples) and the heat source 40 to provide a gas temperature sufficient to cause any moisture (e.g., water) adsorbed to the powder to be liberated from the powder and removed from reactor 14 with the exiting working gas (step 56). During this fluidization process the individual particles 12 of the powder are separated from one another, and are prevented from sintering because the particles 12 of powder are not maintained in close proximity to each other. The fluidizing of the powder particles 12 is performed at a temperature and for a period of time duration adequate to remove the adsorbed moisture; i.e., dry the powder to an acceptable moisture level.

Once the adsorbed moisture is removed from the particles, the system 10 may be controlled to purge the working gas (now containing the moisture) from the reactor 14. The present disclosure is not limited to any particular process for removing the moisture; e.g., a given volume of working gas may be maintained within the reactor 14 for a given period of time to remove the moisture and subsequently purged, or a volume of working gas may be continuously passed through the reactor 14 to remove the moisture, etc. Any powder particles 12 entrained within the purged gas may be collected in the escaped powder collector vessel 22. The system 10 is controlled to introduce a precursor gas into the reactor 14 via piping 32 at a predefined mass flow using the mass flow control device 20 and valves 26. Depending upon the application at hand, the system 10 may be controlled such that 100% of the gas entering the reactor 14 is the precursor gas, or a mixture of working gas and the precursor gas, or a mixture of one or more of working gas, a first precursor gas, or a second precursor gas. In an application wherein aluminum alloy powder is being processed for subsequent use in an additive manufacturing process, a mixture of a precursor gas (silane —$SiH_4$) and working gas ($N_2$) may be used.

Within the reactor vessel 36, the precursor gas decomposes and deposits a coating on the fluidized powder particles 12 within the vessel (step 58). A precursor gas that enables the deposition of a silicon coating on the powder particles 12 (e.g., silane) is particularly useful when processing aluminum or aluminum alloy powder particles 12 for several reasons. Silane works well as a precursor gas because it starts to decompose into silicon and hydrogen at a mild condition of 250° C. during plasma enhanced chemical vapor deposition (PECVD). Silicon is a composition element within certain aluminum alloys (e.g., aluminum 6061 and 7075). The thickness of the particle coating can be controlled within the system 10 by varying one or more process parameters; e.g., the amount of time that the fluidized powder particles 12 are subjected to the precursor gas, the mixture ratio of the precursor ratio and working gas, etc. Consequently, the amount of silicon added to the powder via the coating process can be controlled so that the amount of silicon in the processed powder (e.g., weight % of silicon within the combined coating and unprocessed powder) is appropriate to arrive at the desired alloy composition; i.e., when the processed powder is subsequently used in an additive manufacturing process, the additively manufactured material has the desired composition percentages. Using the present disclosure, it is possible therefore to add a relatively small percentage of silicon to a powder and the powder will be a viable candidate for additive manufacturing; i.e., reflectance is not an issue. As a result, certain aluminum alloys (i.e., alloys having a low silicon content; wrought Al alloys) become additive manufacturing candidates, which alloys were not previously candidates.

Still further, a coating applied using the present disclosure provides an effective barrier for preventing re-adsorption of moisture onto the powder. As a result, the coated powder can be stored in a typical production environment for an extended period of time without adverse moisture adsorption.

Once the powder has been sufficiently coated in the fluidizing process, the system 10 is controlled to stop the flow of precursor gas. In many instances, the system 10 may be subsequently controlled to continue (or provide) a flow of working gas through the reactor 14. The subsequent flow of working gas is typically provided at a lower temperature. The working gas, therefore, both purges the precursor gas from the system 10 and cools the processed powder within the reactor 14 (step 60). Finally, the system 10 can be controlled to purge the cooled powder from the reactor 14, and the cooled powder can be subsequently collected from the reactor 14 (step 62) and stored in containers for subsequent processing; e.g., additive manufacturing.

Figure 3:
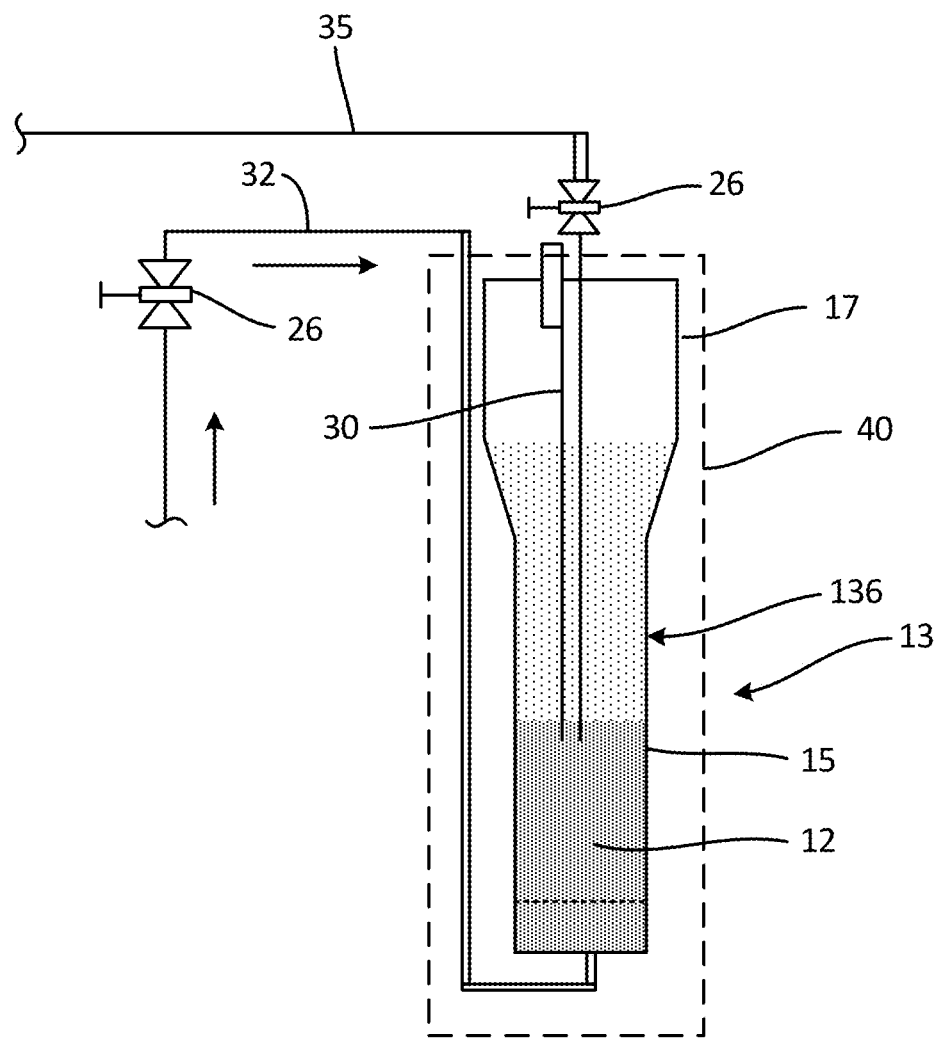
FIG. 3 is a schematic illustration of an embodiment of the present system.
Figure 4:
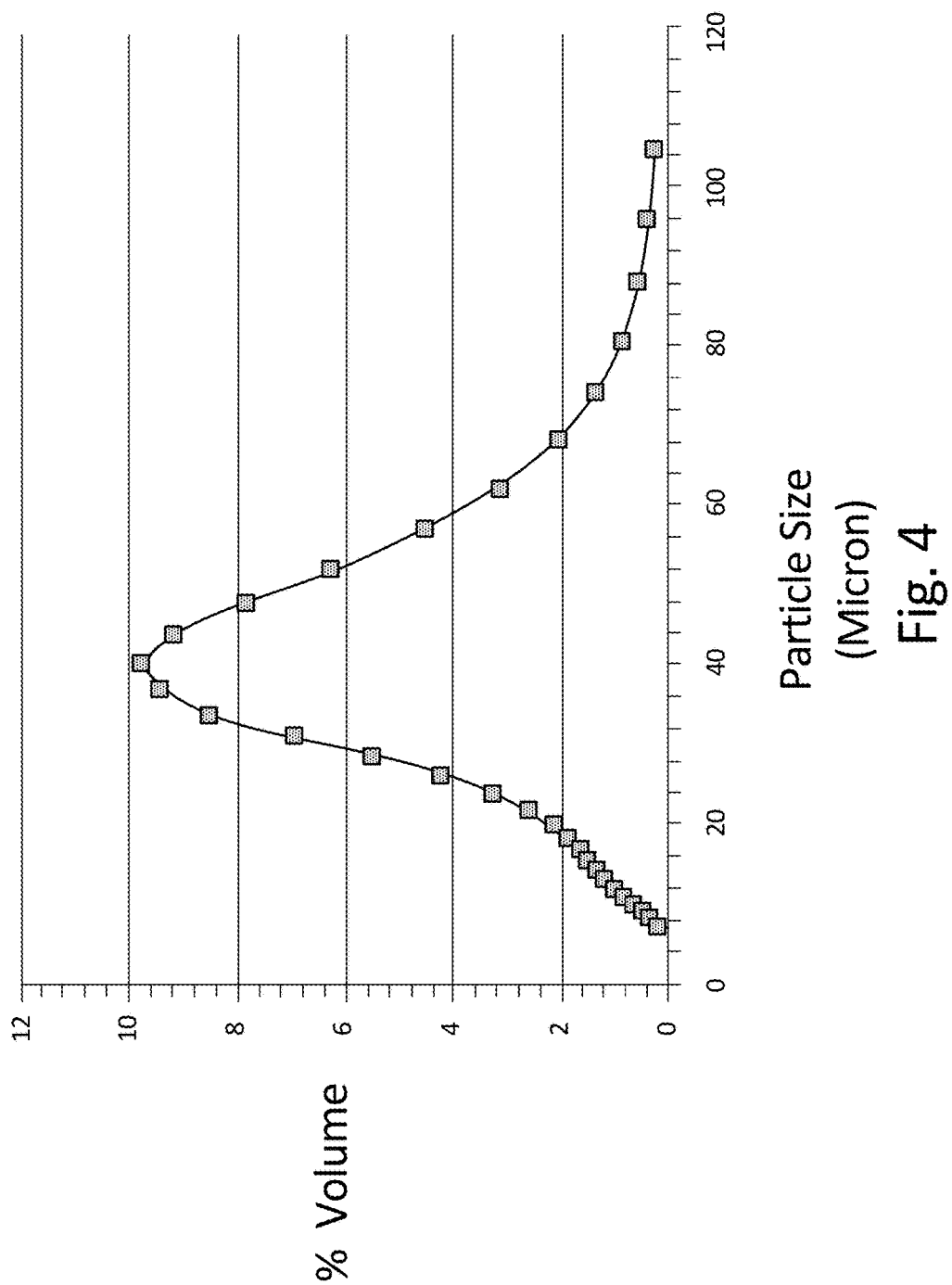
FIG. 4 is a graph showing the particle size distribution of 6061 Al powder.

To demonstrate the success of the coating process described above, a series of aluminum powders were coated with silicon in a reactor in a system identical to that of system 10 in FIG. 1 using process 50 described in FIG. 2, with the exception that the experimental coating system employed a single wall reactor instead of the double wall reactor shown in FIG. 1. A schematic diagram of the single wall reactor used for the experimental coating is shown in FIG. 3. Experimental single wall reactor 13 includes single wall vessel 136, fluidized bed zone 15, disengaging zone 17 and heat source 40, wherein heat source 40 comprises a tubular furnace. A thermocouple 30 provides process temperatures inside vessel 136. Working gases and precursor gases from working gas source 16 and precursor gas source 18 are supplied to the bottom of vessel 136 through piping 32 and valves 26, and exit vessel 136 through valve 26 and piping 35. The working gas and precursor gas entering the bottom of vessel 136 are controlled by valve 26 and mass flow device 20 to fluidize powder particles 12 in vessel 136 as described above in the description of system 10. In the embodiment shown, fluidized bed zone 15 of vessel 136 has an internal diameter of 4.8 cm and disengaging zone 17 of vessel 136 has an internal diameter of 7.3 cm. All examples in the demonstration used 6061 alloy aluminum powder 12. The powder size distribution of the powder is shown in FIG. 4. The mean particle size is about 40 microns.

Figure 5:
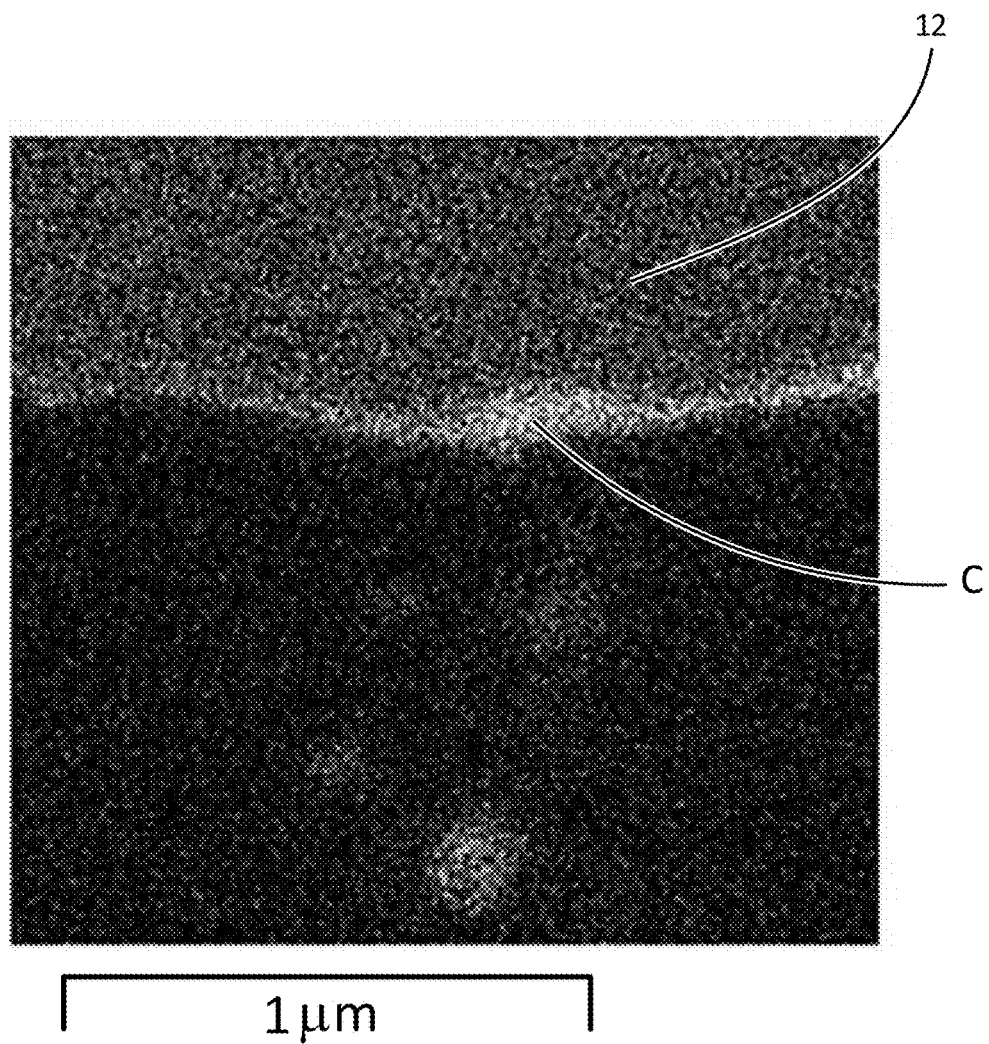
FIG. 5 is a focused ion beam image showing silicon coating on 6061 Al powder.

In the first example, 34 grams of powder 12 were loaded in reactor 13 (step 52). A flow of 0.5 liters/min of $N_2$ gas from working gas source 16 was fed into reactor 13 to purge the system and fluidize aluminum powder 12 (step 54). Reactor 13 was then heated to 400° C. for about 4-8 hours to remove any moisture adsorbed on the powder (step 56). Reactor 13 was then heated to 450° C. and a flow of 0.5 liter/min of a 1% $SiH_4$—$H_2$ gas mixture was introduced into reactor 13 for about 2.5 hours to coat the particles 12 with silicon (step 58). Reactor 13 was then cooled down and purged with $N_2$ gas (step 60) before reactor 13 was unloaded (step 62). A scanning electron microscope image of a cross-section of a coated particle created using a focused ion beam (FIB) is shown in FIG. 5 wherein the detector was tuned to the K$\alpha$1 x-ray line of silicon. As shown in FIG. 5, a thin silicon coating C on the particle 12 is revealed as a thin bright line. An inductively coupled plasma (ICP) chemical analysis of Fe, Mg, and Si in the powder before and after coating is shown in the following table.

TABLE 1

| ICP Chemical Element Analysis of Example 1 | | | | | | | | |
|---|---|---|---|---|---|---|---|---|
| | Cr | Cu | Fe | Mg | Mn | Si | Ti | Zn | Al |
| 6061 Al powder, wt. % | | | 0.24 | 0.9 | | 0.57 | | | ~95 |

TABLE 1-continued

| ICP Chemical Element Analysis of Example 1 | | | | | | | | |
|---|---|---|---|---|---|---|---|---|
| | Cr | Cu | Fe | Mg | Mn | Si | Ti | Zn | Al |
| Si coated Al 6061 powder, wt. % | | | 0.24 | 0.9 | | 2.05 | | | ~95 |

Figure 6:
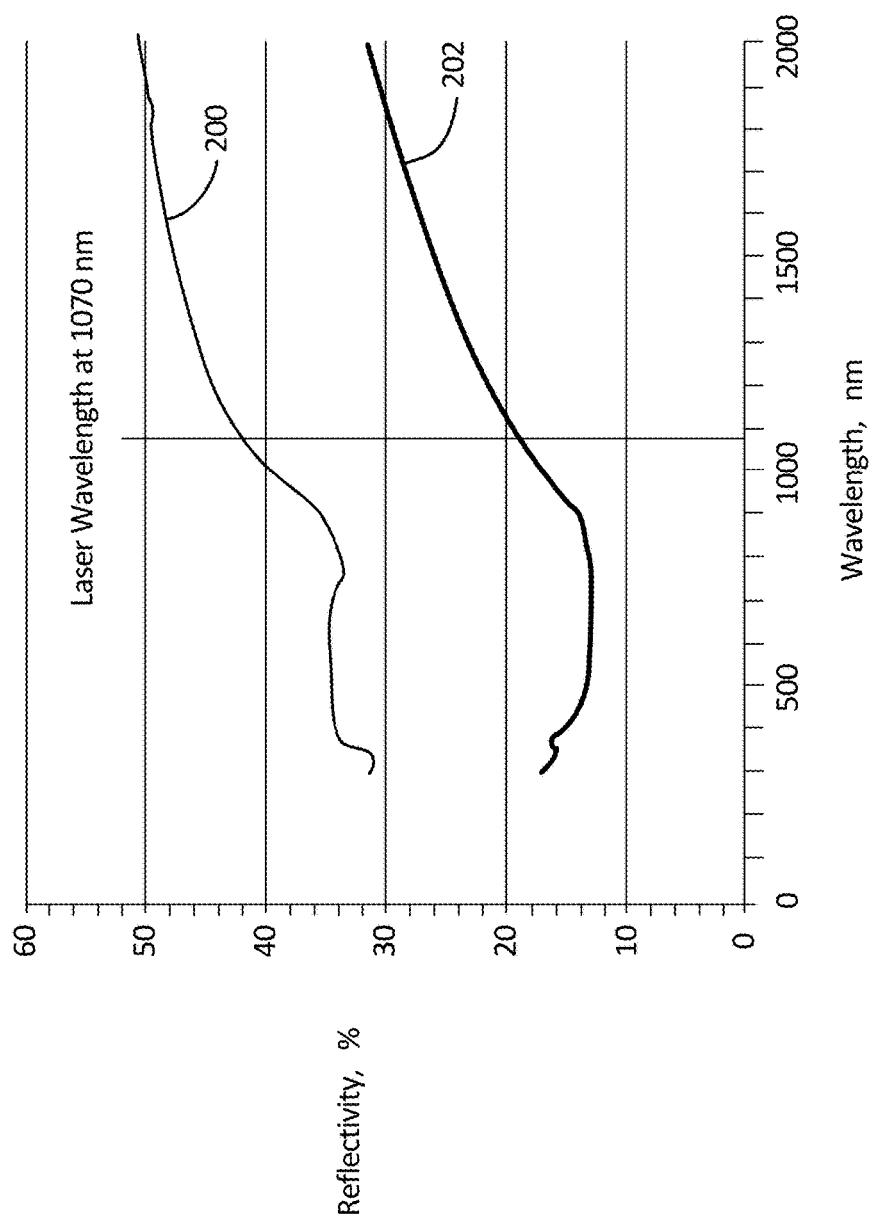
FIG. 6 are reflectivity measurements of coated and uncoated 6061 Al powder.

The chemical analysis was restricted to Fe, Mg, and Si. The coating process increased the Si content from 0.57 to 2.05 wt. %. Reflectivity measurements on the 6061 Al powder before (curve 200) and after (curve 202) coating are shown in FIG. 6. As indicated in FIG. 6, the reflectivity at 1070 nm is decreased by 55% making the powder useful as a feedstock in an additive manufacturing process. The 1070 nm wavelength is indicated on the figure because a 1070 nm laser is a common laser in additive manufacturing production systems. As FIG. 6 shows, reflectivity of the powder is significantly decreased at other wavelengths as well.

Figure 7:
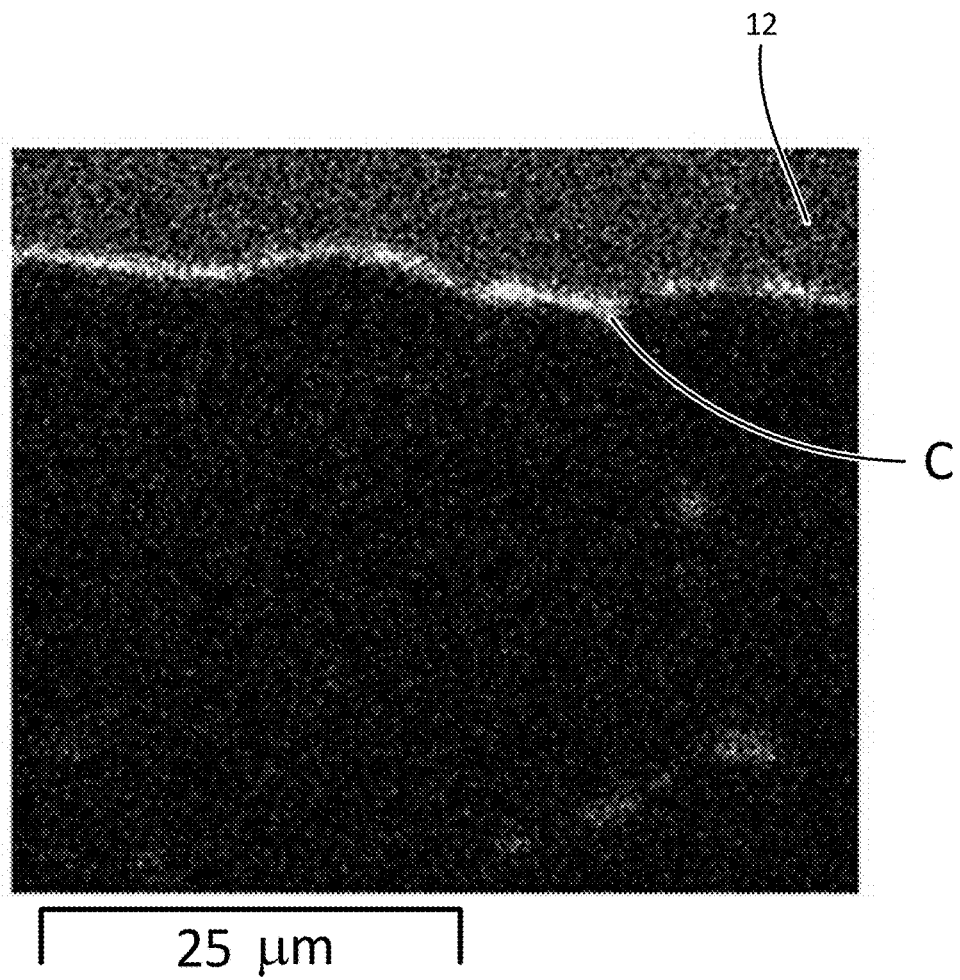
FIG. 7 is a focused ion beam image showing silicon coating on 6061 Al powder.

In another example, 35 grams of the 6061 Al powder were loaded in reactor 13 and the process described above was repeated, with the exception that the 1% $SiH_4$—$H_2$ flowrate was raised to 1.0 liter/min and the coating duration was 7.5 hours before reactor 13 was cooled down and purged with $N_2$ gas before unloading the reactor. A SEM image of an FIB cross-section of a coated particle in which the detector was tuned to the K$\alpha$1 line of silicon is shown in FIG. 7. Silicon coating C is noticeably thicker than for the example pictured in FIG. 5. An ICP chemical analysis of Fe, Mg, and Si in the powder before and after coating is shown in the following table.

TABLE 2

| ICP Chemical Element Analysis of Example 2 | | | | | | | | |
|---|---|---|---|---|---|---|---|---|
| | Cr | Cu | Fe | Mg | Mn | Si | Ti | Zn | Al |
| 6061 Al powder, wt. % | | | 0.24 | 0.9 | | 0.57 | | | ~95 |
| Si coated Al 6061 powder, wt. % | | | 0.24 | 0.8 | | 7.0 | | | ~93 |

Figure 8:
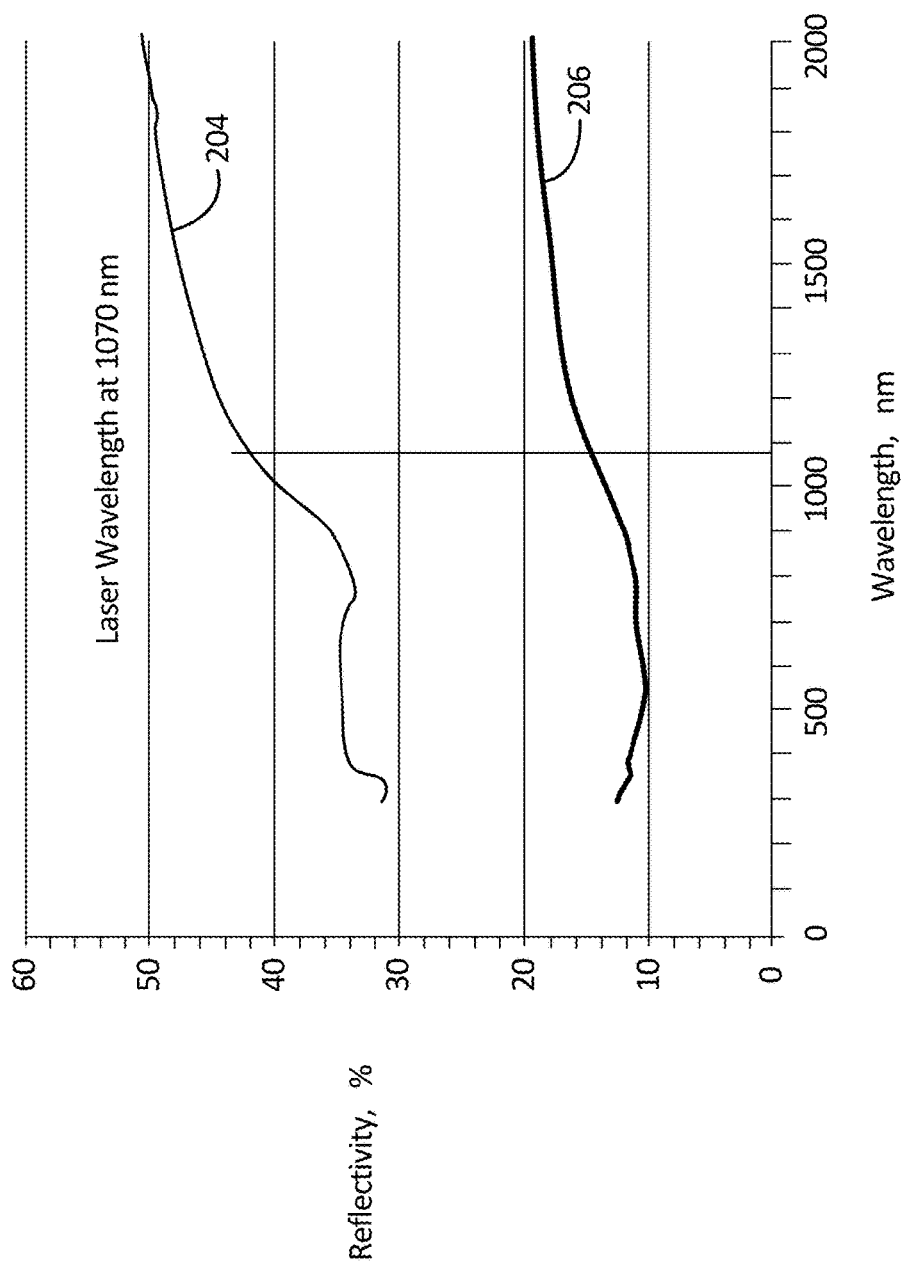
FIG. 8 are reflectivity measurements of coated and uncoated 6061 Al powder.

As expected, the increased silane flowrate and longer duration resulted in a thicker coating and higher silicon composition of 7.0 wt. %. Reflectivity measurements on the 6061 Al powder before (curve 204) and after (curve 206) coating are shown in FIG. 8. As indicated in FIG. 8, the reflectivity at 1070 nm is decreased by 67% (and is significantly decreased at other wavelengths as well).

Figure 9:
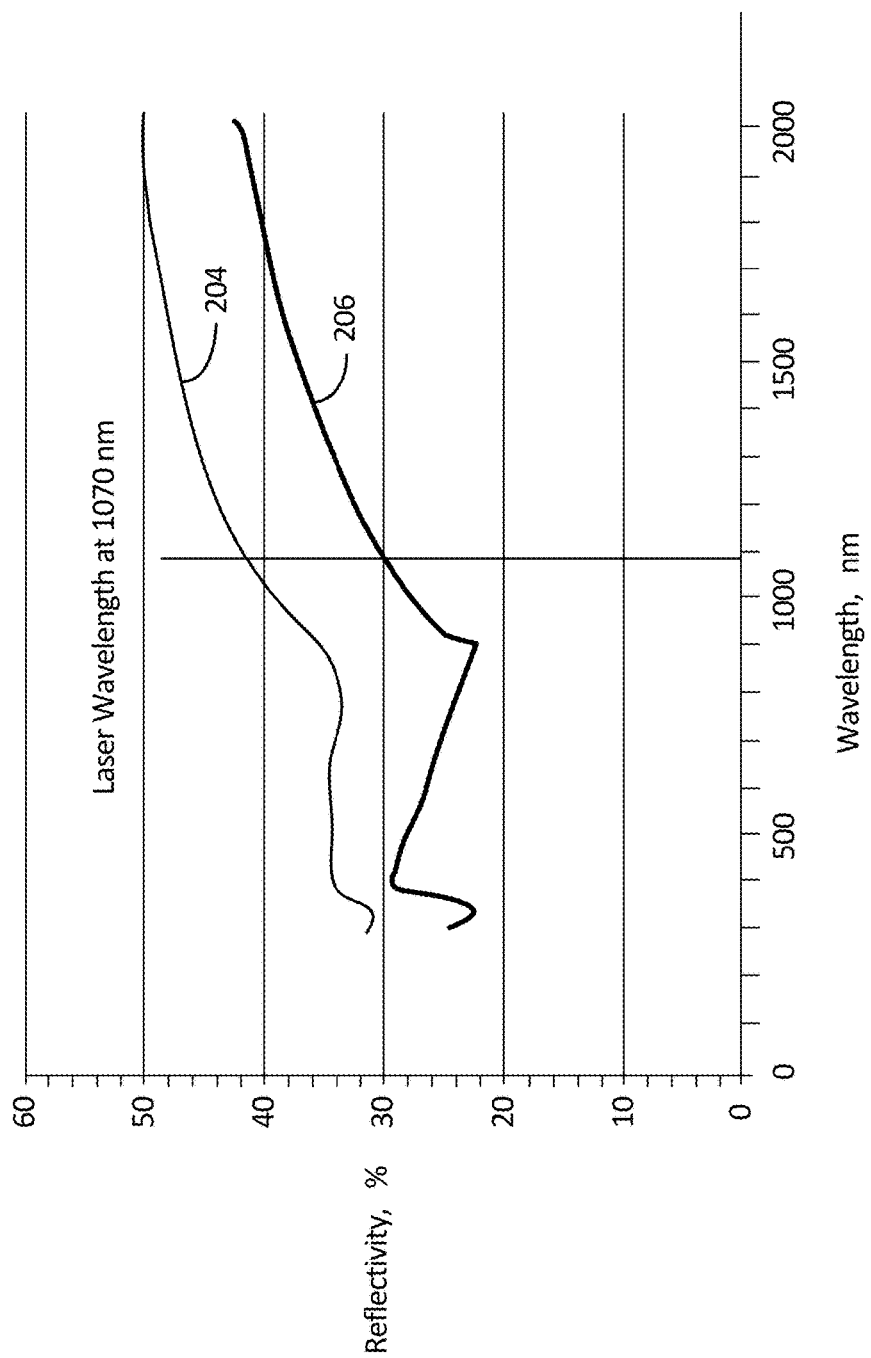
FIG. 9 are reflectivity measurements of coated and uncoated 6061 Al powder.

In another example, 36 grams of 6061 Al powder were loaded in reactor 13. The reactor was then purged with 0.5 liters/min $N_2$ from working gas source 16 which also fluidized the powder. The powder was then degassed at 400° C. for 4-8 hours as before. The coating flowrate was kept at 1.0 liters/min and the coating duration and temperature were 1.0 hours and 386° C. respectively. The ICP chemical analysis showed the total silicon content in the powder was raised from 0.57 wt. % to 0.79 wt. %. As shown in FIG. 9, the reflectivity of the powder decreased at all wavelengths. The reflectivity of the powder at 1070 nm decreased from 42% to 30% for a 29% reduction.

In a further example, 36 grams of 6061 Al powder were loaded in reactor 13 and the reactor was purged with 0.5 liter/min $N_2$ from working gas source 16 as before. The powder was degassed at 400° C. for 4-8 hours again. The coating flowrate was 1.0 liters/min and the coating temperature was raised to 403° C. from 386° C. ICP chemical analysis indicated the total silicon content was raised from 0.57 wt. % to 1.34 wt. %.

In a further example, 36 grams of 6061 Al powder were loaded in reactor 13 and the reactor was purged with 0.5 liter/min as before and then degassed at 400° C. for 4-8 hours. The coating flowrate was 1.0 liter/min and the coating temperature was raised to 431° C. from 403° C. ICP chemical analysis indicated the total silicon content was raised from 1.34 wt. % to 1.85 wt. %.

The examples have successfully demonstrated that the reflectivity of reflective powder feedstock for laser based additive manufacturing can be decreased to allow the particles to be heated by the laser and successfully fused during a build. The last three examples indicated coating temperature was shown to be a major variable on deposition rate with total silicon weight increasing approximately linearly with coating temperature.

Discussion of Possible Embodiments

The following are non-exclusive descriptions of possible embodiments of the present invention.

A method of coating metallic powder particles with silicon includes: disposing an amount of metallic powder particles within a fluidizing reactor; removing moisture adsorbed to the powder particles disposed within the reactor using a working gas at a temperature of from about 350° C. to about 450° C. for about 3-5 hours; coating the powder particles disposed within the reactor with silicon present within a precursor gas at a temperature of from about 300° C. to about 500° C. for about 0.5 hours to about 8 hours; and purging the precursor gas from the reactor using the working gas.

The method of the preceding paragraph can optionally include, additionally and/or alternatively any, one or more of the following features, configurations and/or additional components:

the coating may include coating the powder particles with silicon in an amount such that the coated powder particles have a level of reflectivity that is less than 30% for subsequent processing of the coated powder particles within an additive manufacturing process.

The working gas may include argon, nitrogen, or helium.

The metallic powder particles may be an aluminum alloy.

The aluminum alloy may be at least one of aluminum 5056, aluminum 6061, aluminum 7075 or PANDALLOY aluminum alloy.

The aluminum alloy may be aluminum 6061.

Removing moisture adsorbed to the powder particles using a working gas at an elevated temperature for a predetermined time may be heating nitrogen to about 400° C. for about 4-8 hours.

The precursor gas may be at least one of silane ($SiH_4$), disilane ($Si_2H_6$), chlorosilane ($SiH_3Cl$), or dichlorosilane ($SiH_2Cl_2$).

Coating the powder particles with silicon within a precursor gas at a predetermined temperature for a predetermined time may be coating the particles with a 1% $SiH_4$—$H_2$ gas mixture at about 450° C. for about 0.5-3 hours.

A method of coating metallic powder particles with silicon may include: providing a system having a fluidized reactor, a working gas source, a precursor gas source, and a processor adopted to execute instructions to control and monitor operation of the system, wherein the processor is in communication with a memory operable to store the executable instructions; disposing an amount of metallic powder particulates within the fluidizing reactor; control the system to remove moisture adhered to the powder particles disposed within the reactor using a working gas provided from the working gas source at from about 350° C. to about 450° C. temperature for about 3 hours to about 5 hours; controlling the system to coat the powder particles disposed within the reactor with silicon present in a precursor gas provided form the precursor gas source at a temperature of from about 300° C. to about 500° C. for about 0.5 hours to about 6 hours; and controlling the system to purge the precursor gas from the reactor using the working gas.

The method of the preceding paragraph can optionally include, additional and/or alternatively any, one or more of the following features, configurations and/or additional components:

Controlling the system to coat the powder particles may include coating the powder particles with silicon in an amount such that the coated powder particles have a level of reflectivity that is less than 30% for subsequent processing of the coated powder particles within an additive manufacturing process.

The metallic powder particles may include at least one of aluminum 5056, aluminum 6061, aluminum 7075, or PANDALLOY aluminum alloy.

The aluminum alloy may be aluminum 6061.

Removing moisture with the working gas a predetermined temperature for a predetermined time may be nitrogen at about 400° C. for about 4-8 hours.

A precursor gas may be at least one of silane ($SiH_4$), disilane ($Si_2H_6$), chlorosilane ($SiH_3Cl$), or dichlorosilane ($SiH_2Cl_2$).

Coating the aluminum 6061 particles in the precursor gas at a predetermined temperature for a predetermined time may be coating the particles in a 1% $SiH_4$—$H_2$ gas mixture at a temperature of about 450° C. for about 0.5-3 hours.

A system for coating metallic powder particles with silicon to reduce optical reflectivity by over 50% may include: at least one working gas source; at least one precursor gas source; at least one fluidizing reactor, wherein the fluidizing reactor is in communication with the working gas source and the precursor gas source; and a processor adapted to execute instructions to control operation of the system, wherein the executable instructions are operable to control the system to: remove moisture adhered to the powder particles disposed within the reactor using a working gas provided from the working gas source at about 350° C. to about 450° C. for about 3 hours to about 5 hours; coat the powder particles disposed within the reactor with a material present within a precursor gas provided from the precursor gas source at a temperature from about 300° C. to about 500° C. for about 0.5 hours to about 6 hours; and purge the precursor gas from the reactor using the working gas.

The system of the preceding paragraph can optionally include, additionally and/or alternatively any, one or more of the following features, configurations and/or additional components:

The powder particles may be aluminum alloy 6061.

The moisture may be removed at about 400° C. for about 4-8 hours in a nitrogen working gas.

The aluminum alloy 6061 particles may be coated with silicon in a 1% $SiH_4$—$H_2$ gas mixture at a temperature of about 450° C. for about 0.5-3 hours.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of coating metallic powder particles with silicon comprising:
   disposing an amount of metallic powder particles within a fluidizing reactor;
   removing moisture adsorbed to the powder particles disposed within the reactor using a working gas at a temperature of from about 350° C. to about 450° C. for about 3 to 8 hours;
   coating the powder particles disposed within the reactor with silicon present within a precursor gas at a temperature of from about 300° C. to about 500° C. for about 0.5 hours to about 7.5 hours; and
   purging the precursor gas from the reactor using the working gas;
   wherein the coating includes coating the powder particles with silicon in an amount such that the coated powder particles have an optical reflectivity that reflects less than 30% of incident light for subsequent processing of the coated powder particles within an additive manufacturing process.

2. The method of claim 1, wherein the working gas comprises argon, nitrogen or He.

3. The method of claim 1, wherein the metallic powder particles are aluminum alloy.

4. The method of claim 3, wherein the aluminum alloy is selected from a group consisting of aluminum 5056, aluminum 6061, and aluminum 7075.

5. The method of claim 4, wherein the aluminum alloy comprises aluminum 6061.

6. The method of claim 1, wherein removing moisture adsorbed to the powder particles using a working gas at an elevated temperature for a predetermined time comprises heating in nitrogen to about 400° C. for about 4-8 hours.

7. The method of claim 1, wherein the precursor gas is selected from the group consisting of silane ($SiH_4$), disilane ($Si_2H_6$), chlorosilane ($SiH_3Cl$), and dichlorosilane ($SiH_2Cl_2$).

8. The method of claim 1, wherein coating the powder particles, disposed within the reactor, with silicon within a precursor gas comprises exposing the particles to a 1% $SiH_4$-$H_2$ gas mixture at a temperature of about 450° C. for about 0.5-3 hours.

9. A method of coating metallic powder particles with silicon, comprising:
   providing a system having a fluidized reactor, a working gas source, a precursor gas source, and a processor adapted to execute instructions to control and monitor operation of the system, wherein the processor is in communication with a memory operable to store the executable instructions;
   disposing an amount of metallic powder particles within the fluidizing reactor;
   controlling the system to remove moisture adhered to the powder particles disposed within the reactor using a working gas provided from the working gas source at from about 350° C. to about 450° C. temperature for about 3 hours to about 8 hours;
   controlling the system to coat the powder particles disposed within the reactor with silicon present in a precursor gas provided from the precursor gas source at a temperature of from about 300° C. to about 500° C. for about 0.5 hours to about 7.5 hours such that the coated powder particles have an optical reflectivity that reflects less than 30% of incident light for subsequent processing of the coated powder particles within an additive manufacturing process; and
   controlling the system to purge the precursor gas from the reactor using the working gas.

10. The method of claim 9, wherein the metallic powder particles are selected from a group consisting of aluminum 5056, aluminum 6061, and aluminum 7075.

11. The method of claim 10, wherein the aluminum alloy comprises aluminum 6061.

12. The method of claim 9, wherein removing moisture with the working gas, at a predetermined temperature for a predetermined time comprises nitrogen at about 400° C. for about 4-8 hours.

13. The method of claim 9, wherein the precursor gas is selected from a group consisting of silane ($SiH_4$), disilane ($Si_2H_6$), chlorosilane ($SiH_3Cl$), and dichlorosilane ($SiH_2Cl_2$).

14. The method of claim 11, wherein coating the aluminum 6061 particles in the precursor gas at a predetermined temperature for a predetermined time comprises coating the particles in a 1% $SiH_4$-$H_2$ gas mixture at a temperature of about 450° C. for about 0.5-3 hours.

15. A system for coating metallic powder particles to configure the metallic powder particles for use in an additive manufacturing process, the metallic powder particles being coated with silicon to reduce optical reflectivity of the coated metallic particles to 30% or less, the system comprising:
   at least one working gas source;
   at least one precursor gas source;
   at least one fluidizing reactor, wherein the fluidizing reactor is in communication with the working gas source and the precursor gas source; and
   a processor adapted to execute instructions to control operation of the system, wherein the executable instructions are operable to control the system to:
      remove moisture adhered to the powder particles disposed within the reactor using a working gas provided from the working gas source at about 350° C. to about 450° C. for about 3 hours to about 8 hours;
      coat the powder particles disposed within the reactor with a material present within a precursor gas provided from the precursor gas source at a temperature of from about 300° C. to about 500° C. for about 0.5 hours to about 7.5 hours to produce coated powder particles having an optical reflectivity that reflects 30% of incident light or less; and
      purge the precursor gas from the reactor using the working gas.

16. The system of claim 15, wherein the metallic powder particles are aluminum alloy 6061 particles.

17. The system of claim 15, wherein the moisture is removed at about 400° C. for about 4-8 hours in a nitrogen working gas.

18. The system of claim 15, wherein the metallic powder particles are coated with silicon in a 1% $SiH_4$-$H_2$ gas mixture at a temperature of about 450° C. for about 0.5-3 hours.

* * * * *